(12) United States Patent
Li et al.

(10) Patent No.: US 10,878,991 B2
(45) Date of Patent: Dec. 29, 2020

(54) SPARSE-ROUTED MAGNETIC COILS FOR WIRELESS POWER CHARGING SYSTEM

(71) Applicant: Shenzhen Yichong Wireless Power Technology Co. Ltd., Guangdong (CN)

(72) Inventors: Tun Li, San Jose, CA (US); Dawei He, Burlingame, CA (US); Siming Pan, San Jose, CA (US); Fangming An, Beijing (CN); Jingdong Sun, Rolla, MO (US)

(73) Assignee: SHENZHEN YICHONG WIRELESS POWER TECHNOLOGY CO. LTD, Shenzhen (CN)

( * ) Notice: Subject to any disclaimer, the term of this patent is extended or adjusted under 35 U.S.C. 154(b) by 0 days.

(21) Appl. No.: 15/800,142

(22) Filed: Nov. 1, 2017

(65) Prior Publication Data

US 2018/0277298 A1    Sep. 27, 2018

Related U.S. Application Data

(60) Provisional application No. 62/474,720, filed on Mar. 22, 2017.

(51) Int. Cl.
| | |
|---|---|
| *H01F 27/28* | (2006.01) |
| *H01F 27/00* | (2006.01) |
| *H01F 38/14* | (2006.01) |
| *G06F 30/36* | (2020.01) |
| *G06F 30/367* | (2020.01) |

(Continued)

(52) U.S. Cl.
CPC ..... *H01F 27/2823* (2013.01); *G06F 30/3323* (2020.01); *G06F 30/36* (2020.01); *G06F 30/367* (2020.01); *H01F 27/006* (2013.01); *H01F 27/2804* (2013.01); *H01F 38/14* (2013.01); *H02J 7/025* (2013.01); *H02J 50/12* (2016.02);

(Continued)

(58) Field of Classification Search
USPC ......................................................... 320/108
See application file for complete search history.

(56) References Cited

U.S. PATENT DOCUMENTS

| | | | |
|---|---|---|---|
| 2009/0212042 A1* | 8/2009 | Lee ...................... | H05B 6/1272 219/624 |
| 2013/0180615 A1* | 7/2013 | Ragner .................. | F16L 11/118 138/119 |

(Continued)

FOREIGN PATENT DOCUMENTS

| | | |
|---|---|---|
| CN | 102611210 A | 7/2012 |
| CN | 103023119 A | 4/2013 |

(Continued)

OTHER PUBLICATIONS

International Preliminary Report of Patentability, Written Opinion of the International Searching Authority, and International Search Report issued in related International Application PCT/CN2018/078920, dated May 31, 2018, 17 pages.

*Primary Examiner* — Mohammed Alam
(74) *Attorney, Agent, or Firm* — Sheppard Mullin Richter & Hampton LLP

(57) ABSTRACT

A sparse routing coil structure for a magnetic coil in a wireless charging system is disclosed. The sparse routing coil structure may include a magnetic coil routed by turns of a wire and a turn spacing S between adjacent turns of the wire. The turn spacing S may be a space between adjacent turns of the wire, and a turn width is denoted as W. A ratio of W/S may be not larger than 10.

13 Claims, 5 Drawing Sheets

(51) Int. Cl.
*G06F 30/3323* (2020.01)
*H02J 50/12* (2016.01)
*H02J 7/02* (2016.01)
*H05K 1/02* (2006.01)
*H05K 1/16* (2006.01)

(52) U.S. Cl.
CPC ..... *H05K 1/028* (2013.01); *H01F 2027/2809* (2013.01); *H05K 1/165* (2013.01)

(56) References Cited

U.S. PATENT DOCUMENTS

| | | | |
|---|---|---|---|
| 2013/0183417 A1* | 7/2013 | Parsche | A23L 3/005 |
| | | | 426/241 |
| 2014/0062181 A1* | 3/2014 | Bohori | H02J 50/12 |
| | | | 307/9.1 |
| 2014/0097928 A1* | 4/2014 | Tomonari | H01F 17/045 |
| | | | 336/207 |
| 2015/0381001 A1* | 12/2015 | Tsuiki | H02K 3/28 |
| | | | 310/208 |
| 2016/0247625 A1* | 8/2016 | Tomonari | H01F 17/045 |
| 2018/0277298 A1* | 9/2018 | Li | H05K 1/028 |

FOREIGN PATENT DOCUMENTS

| | | |
|---|---|---|
| CN | 105845404 A | 8/2016 |
| CN | 106026417 A | 10/2016 |
| CN | 106130191 A | 11/2016 |

\* cited by examiner

SPARSE-ROUTED MAGNETIC COILS FOR WIRELESS POWER CHARGING SYSTEM

CROSS-REFERENCE TO RELATED APPLICATIONS

This application claims the benefit of U.S. Provisional Application Ser. No. 62/474,720, filed Mar. 22, 2017, and entitled "SPARSE-ROUTED MAGNETIC COILS FOR WIRELESS POWER CHARGING SYSTEM". The entirety of the aforementioned application is incorporated herein by reference.

TECHNICAL FIELD

The disclosure relates generally to a wireless charging system and method, particularly, to a magnetic coil with a sparse routing structure and a method of designing the sparse routing structure for magnetic coils in a wireless charging system.

BACKGROUND

Wireless charging is an evolving technology that may bring a new level of convenience of charging electronic devices. In a wireless charging system, particularly an inductive wireless charging system, energy is transferred from one or more power transmitter (TX) coils to one or more power receiver (RX) coils through magnetic coupling.

Charging efficiency is defined as the ratio of a receiver side output power over a transmitter side input power. For instance, the receiver side output power may be the power applied to a load on the receiver side (e.g., a battery), and the transmitter side input power may be a power input at power input nodes. An increase of the charging efficiency will effectively lower energy wastes during power transfer, and reduce heat dissipation and over-voltage damages of the charging and to-be-charged devices. Further a higher charging efficiency may also reduce unnecessary electromagnetic radiation, and thus, prevent potential influences of wireless power transfer on human health.

A coil-to-coil efficiency is one of the factors that affect the charging efficiency. The coil-to-coil efficiency is defined as the efficiency between a TX coil and an RX coil, and calculated by the ratio of the output power of the RX coil (e.g., alternating current power, i.e., AC power) over the input power of the TX coil (e.g., input AC power). The loss that affects the coil-to-coil efficiency includes the coil-to-coil loss, parasitic resistance loss of the TX and RX matching capacitors, etc. By way of designing a magnetic coil structure, the charging efficiency can be improved, particularly, the coil-to-coil efficiency.

SUMMARY

One aspect of this disclosure is directed to a sparse routing coil structure for a magnetic coil in a wireless charging system. The sparse routing coil structure may include a magnetic coil routed by turns of a wire and a turn spacing S (edge-to-edge) between adjacent turns of the wire. The turn spacing S may be a space between adjacent turns of the wire. A turn width can be denoted as W. A ratio of W/S may be not larger than 10.

Another aspect of this disclosure is directed to a method for designing a sparse routing coil structure of a magnetic coil. The method may include obtaining values of self-inductances and mutual inductance for TX and RX magnetic coils; calculating a coupling coefficient based on the values of the self-inductances and mutual inductance; obtaining an outer diameter OD, inner diameter ID and turn number N of one magnetic coil from simulation results; calculating a total width T, which is the sum of a trace diameter D and a turn spacing S; obtaining simulation results of a coil-to-coil efficiency by simulations with different values of the turn width W and the turn spacing S; and determining the turn width W and the turn spacing S for the sparse routing coil structure based on the simulation results.

Another aspect of this disclosure is directed to a wireless charging system. The system may include a power transmitter and a power receiver. The power transmitter may include one or more power transmitter coils. The power transmitter coil may be coupled to one or more power receiver coils. The power receiver may include the one or more power receiver coils, and may be configured to charge a device. The one or more power receiver coils each may include a wire routed into the power receiver coil and a turn spacing S between adjacent turns of the wire.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this disclosure, illustrate several non-limiting embodiments and, together with the description, serve to explain the disclosed principles.

DETAILED DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Figure 1:
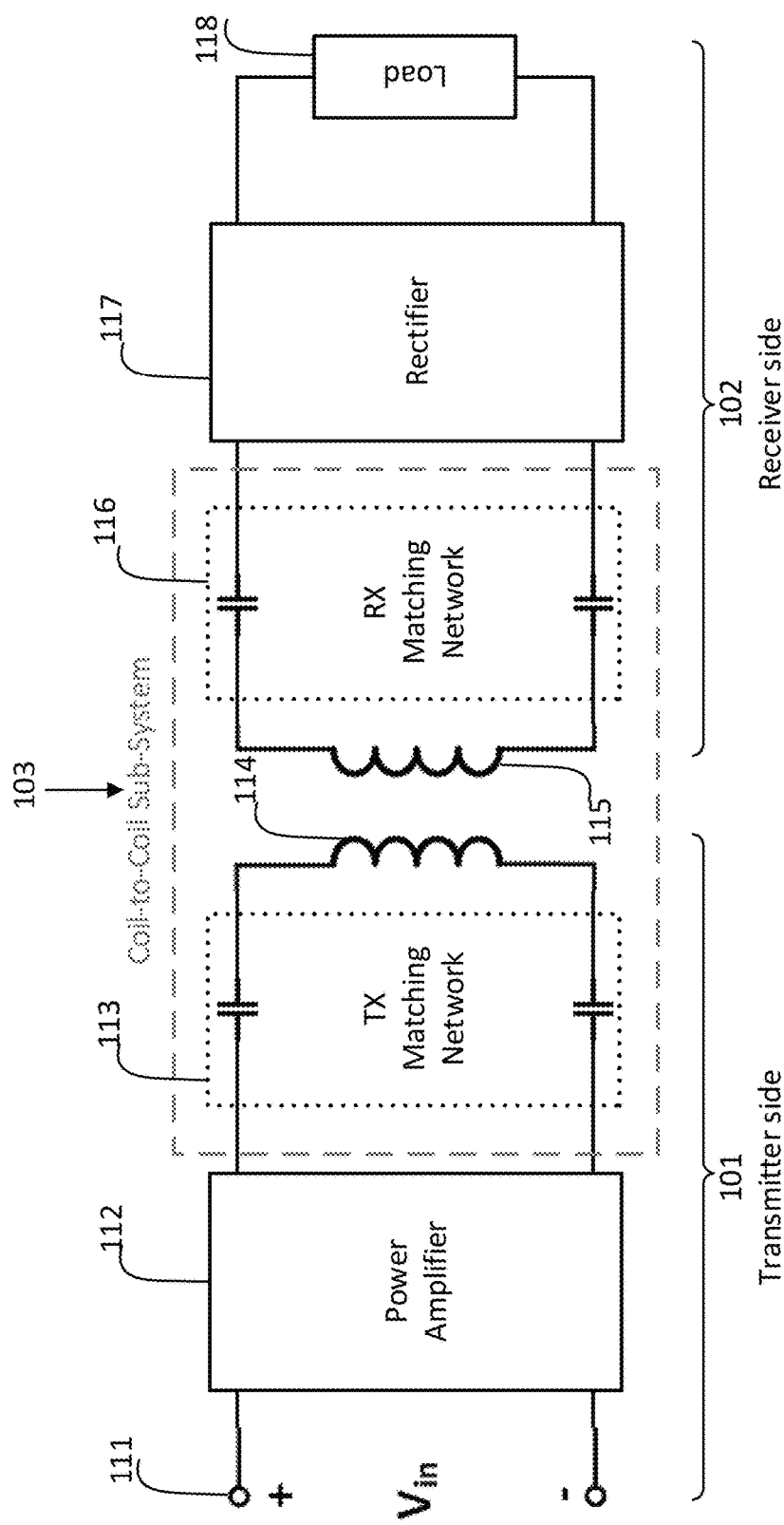
FIG. 1 is a block diagram illustrating a wireless charging system, consistent with exemplary embodiments of the present disclosure.

FIG. 1 is a block diagram illustrating a wireless charging system 100, consistent with exemplary embodiments of the present disclosure. The system 100 may comprise a number of components, some of which may be optional. In some embodiments, the system 100 may include many more components than those shown in FIG. 1. However, it is not necessary that all of these components be shown in order to disclose an illustrative embodiment.

The system 100 may include a transmitter side 101 and a receiver side 102. The transmitter side 101 may include power input nodes (+ and −) 111, a power amplifier 112, and a power transmitter. The power transmitter may include a TX matching network 113, and one or more TX coils 114. The receiver side 102 may include a power receiver, a rectifier 117, and a load 118 of a RX device. The power receiver may include one or more RX coils 115 and a RX matching network 116. The load 118 can be a battery of a device to be charged. The device can be a mobile device, a wearable device, a tablet device, a computer, a car, or any device that includes a chargeable battery. The one or more RX coils can be coupled to the device. The power input nodes 111 may be coupled to the power amplifier 112. The power amplifier 112 may be coupled to the TX matching network 113. The TX matching network 113 may be coupled to one or more TX coils 114. The TX matching network 113 may include one or more capacitors. Capacitance of one or more of the capacitors may be adjustable. The TX matching network 113 and the TX coil(s) 114 may form a resonant circuit or an LC circuit where the L represents the TX coil(s) and C represents the capacitor connected together. The frequency of the LC circuit can be adjusted by adjusting the capacitance of the TX matching network 113. The TX coil(s) 114 may be coupled with one or more RX coils 115 via magnetic coupling. In the receiver side 102, the RX coil(s) 115 may be coupled to the RX matching network 116, the RX matching network 116 may be coupled to the rectifier 117, and the rectifier 117 may be coupled to the load 118. The RX matching network 116 may include one or more capacitors. One or more capacitors may have adjustable capacitance. The capacitors may be used to adjust the frequency of an LC circuit formed by the RX coil(s) 115 and the RX matching network 116. Accordingly, the resonant frequency of the LC circuit can be determined by tuning the capacitance of the capacitors. The TX matching network 113, TX coil(s) 114, RX coil(s) 115 and RX matching network 116 form a coil-to-coil sub-system 103.

An input voltage is converted from a DC power to an AC power and amplified by the power amplifier 112. Then the power is transmitted from the transmitter side 101 to the receiver side 102 through two or more coupled magnetic coils. The AC voltage received at the receiver side 102 is regulated back to a DC voltage by the rectifier 117 and then delivered to the load 118.

Figure 2:
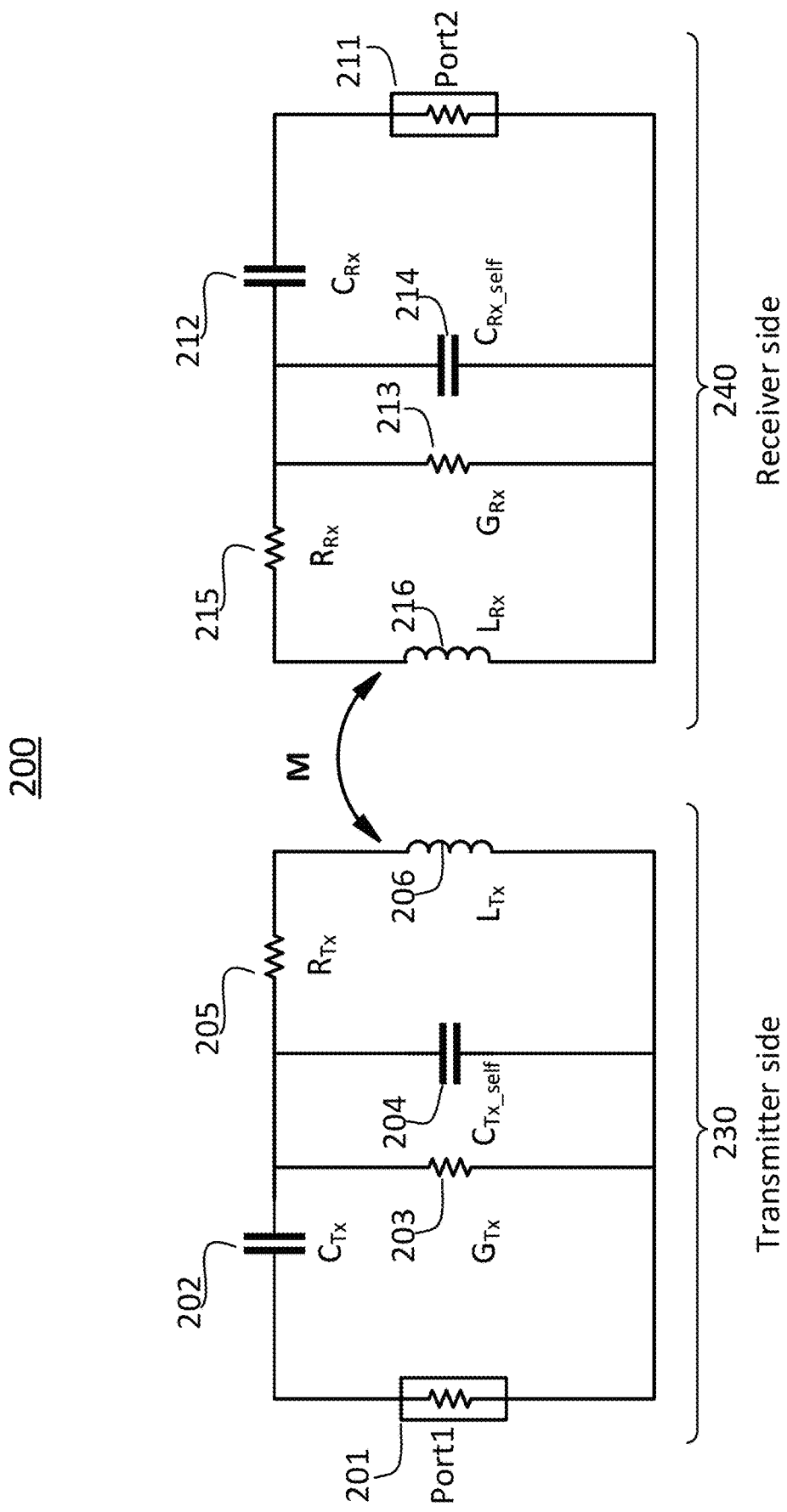
FIG. 2 is a graphical representation illustrating a circuit formulation of a coil-to-coil sub-system, consistent with exemplary embodiments of the present disclosure.

A circuit formulation 200 of the coil-to-coil sub-system is shown in FIG. 2, consistent with exemplary embodiments of the present disclosure. The circuit 200 may comprise a number of components, some of which may be optional. In some embodiments, the circuit 200 may include many more components than those shown in FIG. 2. However, it is not necessary that all of these components be shown in order to disclose an illustrative embodiment.

As shown in FIG. 2, the circuit 200 may include a transmitter side 230 and a receiver side 240. An inductor, like the TX coil and the RX coil in FIG. 1, typically introduces inductance, resistance, and capacitance into the circuit. In addition, the coating and dielectric materials on the inductor introduce electrical conductance into the circuit as well. FIG. 2 shows the circuit formulation with these introduced components decomposed. The transmitter side 230 may include a port (Port 1) 201, a matching capacitor 202 for the TX coil(s), denoted as $C_{Tx}$; a G-term 203, denoted as $G_{Tx}$; a self-capacitance 204 of the TX coil(s), denoted as $C_{Tx\_self}$; a resistance 205 of the TX coil(s), denoted as $R_{Tx}$; and a self-inductance 206 of the TX coil(s), denoted as $L_{Tx}$. Similarly, the receiver side 240 may include a port (Port 2) 211, a matching capacitor 212 for the RX coil(s), denoted as $C_{Rx}$; a G-term 213, denoted as $G_{Rx}$; a self-capacitance 214 of the RX coil(s), denoted as $C_{Rx\_self}$; a resistance 215 of the RX coil(s), denoted as $R_{Rx}$; and a self-inductance 216 of the RX coil(s), denoted as $L_{Rx}$.

In some embodiments, in the transmitter side 230, Port 1 (201) is connected to the matching capacitor 202, and the capacitance of the matching capacitor 202 may be adjustable. The matching capacitor 202 is connected to the TX coil(s), forming a resonant circuit. The frequency of the resonant circuit can be adjusted by adjusting the capacitance of the matching capacitor 202. The G-term 203 is a type of electrical conductance, which is introduced by coating materials or dielectric materials of the TX coil(s). The effect of the TX coil(s) may be further represented as the self-capacitance 204, the resistance 205, and the self-inductance 206.

Similarly, in the receiver side 240, Port 2 (211) is connected to the matching capacitor 212, and the capacitance of the matching capacitor 212 may be adjustable. Similar to the G-term 203, the G-term 213 is also a type of electrical conductance, and is introduced by coating materials or dielectric materials of the RX coil(s). The matching capacitor 212 is connected to the RX coil(s), forming a resonant circuit. The frequency of the resonant circuit can be adjusted by adjusting the capacitance of the matching capacitor 212. The effect of the RX coil(s) may be further represented as the self-capacitance 214, the resistance 215, and the self-inductance 216. The TX coil(s) and the RX coil(s) are magnetically coupled through the self-inductance 206 of the TX coil(s) and the self-inductance 216 of the RX coil(s) with a mutual inductance M.

The coil-to-coil efficiency may be determined by the components and/or parameters discussed above. Both a conventional tight routing coil design and a sparse routing coil structure can increase the charging efficiency by optimizing the self-inductance $L_{Tx}$, $L_{Rx}$ and mutual-inductance M. The sparse routing coil structure may further increase the coil-to-coil efficiency by reducing the G-terms $G_{Tx}$ and $G_{Rx}$, the resistance $R_{Tx}$ and $R_{Rx}$, and the self-capacitance $C_{Tx\_self}$ and $C_{Rx\_self}$.

A lower self-capacitance of an inductor may help increase the self-resonant frequency of the inductor, and thus increase the coil-to-coil efficiency. A self-resonant frequency of a magnetic coil is determined by the magnetic coil's self-inductance and self-capacitance, $$\text{i.e., } f_0 = \frac{1}{2\pi\sqrt{LC}}.$$

The self-resonant frequency of the magnetic coils may affect the efficiency of the system if its value is close to the operation frequency of the system. In order to set the self-resonant frequency of the magnetic coils far away from the system's operation frequency, one way is to reduce the self-capacitance of the magnetic coils by a sparse routing coil structure.

Figure 3:
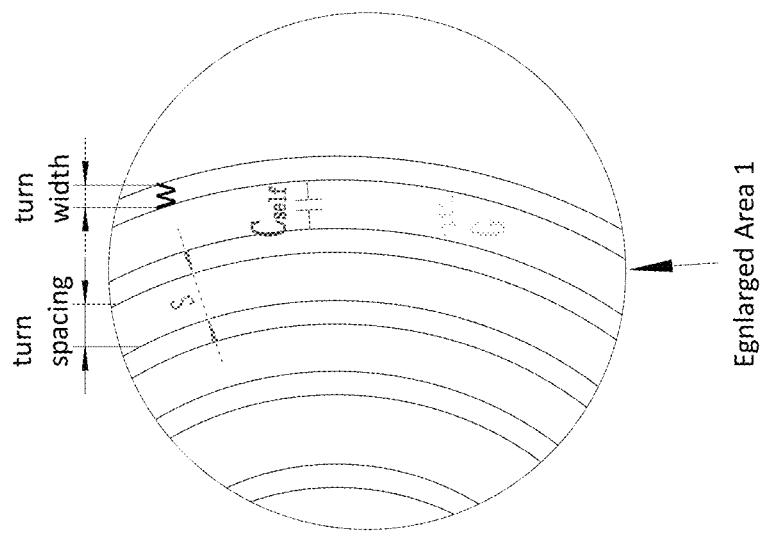
FIGS. 3(a)-3(b) are graphical representations illustrating a top view of a magnetic coil, consistent with exemplary embodiments of the present disclosure.
Figure 3:
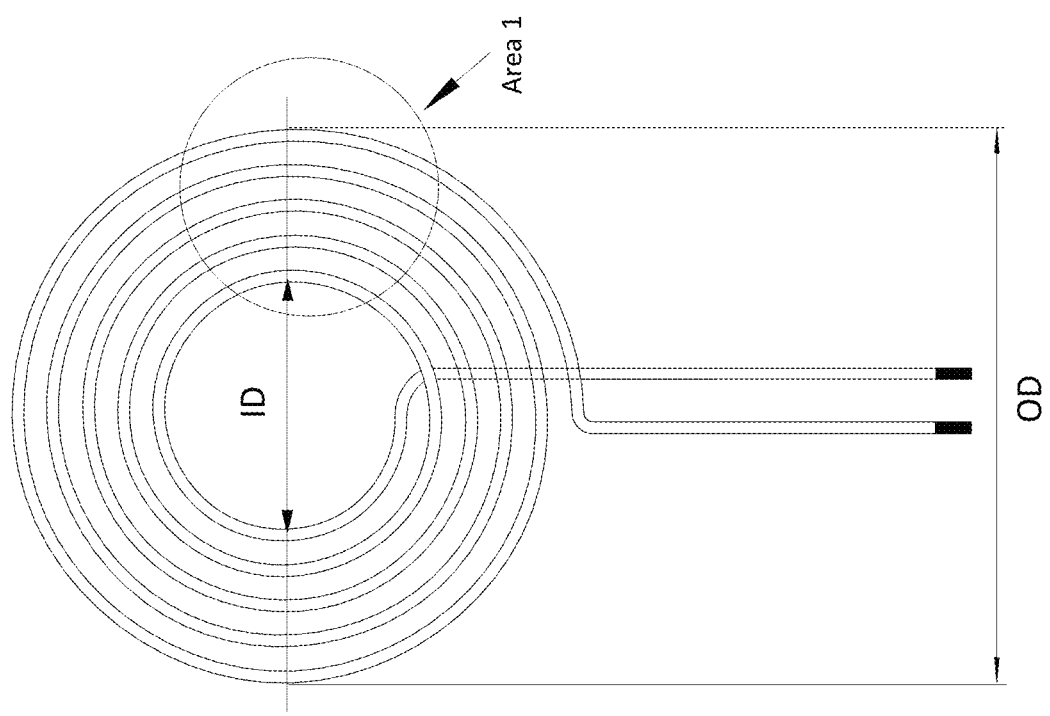

FIGS. 3(a)-(b) are graphical representations illustrating a top view of an exemplary magnetic coil with a sparse routing coil structure, consistent with exemplary embodiments of the present disclosure. As shown in FIG. 3(a), a wire is routed into a circular shaped coil, with two extending terminals. To have a clear view of the routing of the coil, Area 1 is selected and enlarged in FIG. 3(*b*). In one embodiment, each turn of the wire has a width W, and is spaced from an adjacent turn with a turn spacing S. The G-term and the self-capacitance $C_{self}$ between adjacent turns are illustrated in the figure.

In conventional coil structures, the spacing between the adjacent turns is always minimized. In this invention, a sparse routing coil structure is proposed with a much increased turn spacing S between the turns. Since both the G-term and the self-capacitance are proportional to 1/S, a larger turn spacing S can result in a smaller G-term and self-capacitance, thus, may increase the coil-to-coil efficiency by decreasing the resistive loss and increasing the self-resonant frequency.

Also when a high frequency current flowing in adjacent turns, the proximity effect can be introduced, leading to a non-uniform current distribution and increasing the parasitic resistance. In this case, the added space between the turns can reduce the proximity effect and further decrease the resistive loss.

In addition, an Eddy current may be generated when a magnetic flux is perpendicular to a metal or copper surface, which will generate heat dissipation and power loss. The added space between the turns may function as slots on a metal plate, so the Eddy current can be significantly reduced or eliminated and the associated heat dissipation and power loss may be significantly reduced accordingly. Therefore, a sparse routing coil structure is a desirable design to increase the coil-to-coil efficiency.

A sparse routing coil structure can be characterized by a ratio between a turn width W and a turn spacing S. The definitions of the turn width and turn spacing may vary for different wire types and materials.

Figure 4:
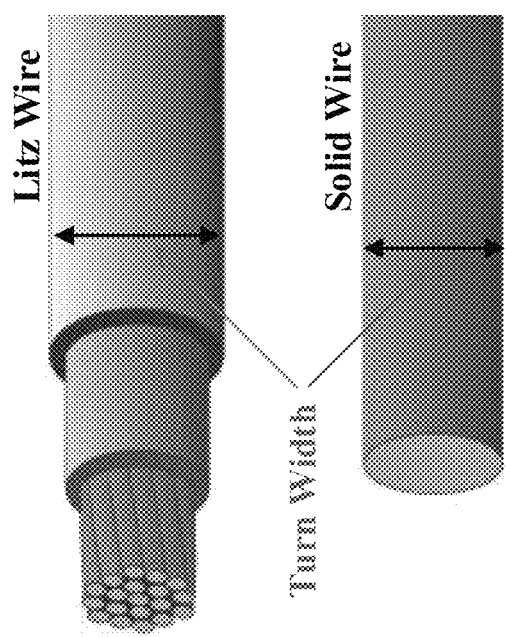
FIG. 4 is a graphical representation illustrating cross sections of a Litz wire and a solid wire, consistent with exemplary embodiments of the present disclosure.

In one embodiment, the wire of the magnetic coil is a solid wire. A solid wire is a single piece of metal wire (e.g., copper or aluminum), and its shape may be circular, as shown in FIG. 4. The turn width W is the diameter of a solid wire, and the turn spacing S is the edge-to-edge distance between the adjacent turns of the solid wire. In some embodiments, a sparse routing coil structure may be:

$$\frac{W}{S} \leq 10.$$

For example, if the diameter of a solid wire is 1 mm, then the turn spacing should be no less than 0.1 mm.

In another embodiment, the wire in the magnetic coil is a Litz wire. A Litz wire is a stranded structure metal wire, and the outer shape of all strands may be circular (including the coating materials), as shown in FIG. 4. The turn width W is the outer diameter of the outer shape of a Litz wire, and the turn spacing S is the edge-to-edge distance between adjacent turns of the Litz wire. In some embodiments, a sparse routing coil structure may be:

$$\frac{W}{S} \leq 10.$$

For example, if the outer diameter of a Litz wire is 1 mm, then the turn spacing should be no less than 0.1 mm.

In another embodiment, the magnetic coil is made of a printed circuit board (PCB) or a flexible printed circuit board (FPCB). A PCB or FPCB coil is formed by thin and flat traces on a PCB board. In some embodiments, a thickness of a PCB/FPCB trace may include a thickness of a copper layer and a thickness of a substrate layer. The thickness of the copper layer may be between 0.3-0.5 mil. The thickness of the substrate layer which may be determined by a specific manufacturing process, may have a value of 62 mil for a PCB substrate and 4 mil for an FPCB substrate. Due to manufacture limitations, a gap can exist between two adjacent PCB/FPCB traces, which is called a trace clearance. The width of the trace clearance, i.e., the horizontal distance between two adjacent traces, may be at least 6 mil, in some embodiments. In a sparse routing coil structure, in addition to the trace clearance, an additional space is intentionally added between every two adjacent traces. Accordingly, the turn spacing S in a sparse routing coil structure is defined as the sum of the clearance and the additional space. The turn width W is the width of a PCB trace. In some embodiments, a sparse routing coil structure may be:

$$\frac{W}{S} \leq 5.$$

For example, it the trace width W is 1 mm, then the turn spacing S should be no less than 0.2 mm. The trace clearance may be around 0.15 mm, accordingly the additional space added to the adjacent traces may be no less than 0.05 mm.

The above mentioned embodiments are given as examples. In some embodiments, a sparse routing coil structure may have one or more layers of coils.

While a larger turn spacing S may lead to a smaller G-term and self-capacitance, it may not necessarily result in a higher efficiency of the whole wireless charging system. For example, in the case that the total center-to-center space (including spacing S and wire width W) between adjacent turns is fixed, if the turn spacing S is too large, the turn width W of each turn may be very small. As the equation of per-unit-length resistance teaches:

$$R_{PUL} = \frac{\rho}{A},$$

where $R_{PUL}$ is the per-unit-length resistance, ρ is the resistivity, and A is the cross-section area, trace or wire resistances may be very large due to the small cross-section area of the trace or wire. This will cause more power wasted on the TX and RX coils themselves, and accordingly decrease the coil-to-coil efficiency. Therefore, there is a tradeoff between the turn width W and the turn spacing S in achieving the optimized charging efficiency of the whole system.

Figure 5:
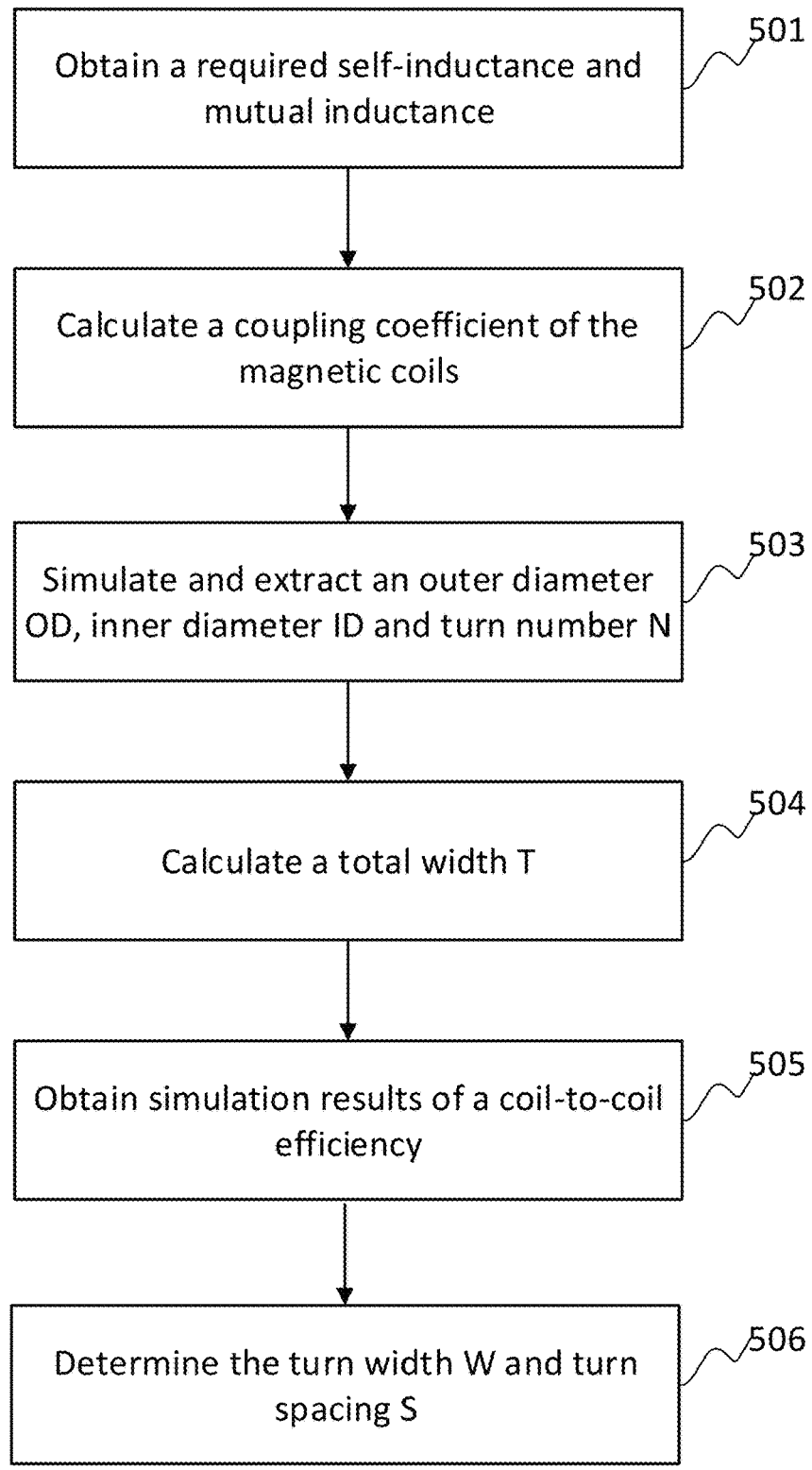
FIG. 5 is a flow diagram illustrating a method of designing a sparse routing coil structure for magnetic coils, consistent with exemplary embodiments of the present disclosure.

This disclosure also proposes a method of determining the turn width W and turn spacing S to optimize the efficiency. FIG. 5 is a flow diagram illustrating a method 500 of designing a sparse routing coil structure for magnetic coils, consistent with exemplary embodiments of the present disclosure. This method may be based on simulations.

At step 501, required values of the self-inductances L and the mutual inductance M of TX and RX coils are obtained. The values of L and M can be pre-determined, e.g., by measurement, calculation, and/or simulation, by a user.

At step 502, a coupling coefficient of the magnetic coils is calculated. The coupling coefficient, denoted as k, characterizes the magnetic coupling between the TX and RX coils. It is defined as:

$$k = \frac{M}{\sqrt{L_{Tx} L_{Rx}}}.$$

Based on the values of L and M obtained at step 501, the coupling coefficient can be calculated accordingly.

From this step, usually one coil is determined first and the second coil is tuned. The self-inductance L of the second coil may be determined by an outer diameter OD, an inner diameter ID and a turn number N. The mutual inductance M may be determined by OD and ID, and may be affected by N. By building a magnetic coil model with corresponding OD, ID and N, the values of L and M can be adjusted by simulations. For example, the magnetic coil model may be assigned with pre-determined OD, ID, and N, and values of L and M can be obtained. OD, ID, and N can be adjusted to achieve required or optimum L and M. Accordingly at step 503, by setting L, M and k as the required values, OD, ID and N can be extracted from the simulation results. In addition, a magnetic coil may have one or more layers of coils based on specific requirements.

At step 504, a total width T is calculated based on the following equation:

$$T = \frac{(OD - ID)}{2 \times N},$$

where the total width is the sum of the turn width and the turn spacing (T=W+S).

Given the value of T is determined at step 504, an increase of the turn width W will lead to a decrease of the turn spacing S, and vice versa. Therefore, at step 505, the coil-to-coil efficiency can be simulated by setting W and S at different values and optimizing the efficiency by tuning W and S at a 0.1 mm interval, for example. Take one embodiment for example, a T is determined to be 1.5 mm, and the magnetic coil is a PCB type. Accordingly, W+S=1.5 mm, and $$\frac{W}{S} \leq 5.$$

To simulate, for instance, W can be set as 1 mm, S can be set as 0.5 mm, and the simulation gives the first value of a coil-to-coil efficiency. Then by tuning W and S at 0.1 mm, for example, setting W=1.1 mm and S=0.4 mm, a second value of the simulated coil-to-coil efficiency can be obtained. As this algorithm continues, multiple values of the coil-to-coil efficiency can be obtained by the simulations with different sets of W and S.

At step 506, comparing the values of the simulated coil-to-coil efficiency, the set of W and S which gives the maximum coil-to-coil efficiency is most desirable for the corresponding sparse routing coil structure. Therefore, the turn width W and the turn spacing S are determined.

TABLE 1

| Parameter | Symbol | Value | Variation Range |
| --- | --- | --- | --- |
| Turn Number | N | 10 | 9-11 |
| Coil Shape | / | Circle | Slightly Elliptical |
| Outer Diameter | OD | 50 mm | ±2 mm |
| Inner Diameter | ID | 25 mm | ±2 mm |
| Turn Spacing | S | 0.65 mm | ±0.1 mm |
| Trace Type | / | Solid Wire | / |
| Trace Material | / | Copper | Similar Material |
| Turn Width | W | 0.6 mm | ±0.1 mm |

Values of the parameters for an exemplary RX coil design are presented in Table 1. Small variations of the values should be considered as within the scope of the structure and design in this disclosure. Potential variation ranges are also presented in Table 1. The number of turns in a magnetic coil may be 10. The magnetic coil may have a circular or slightly elliptical shape with an outer diameter of 50 mm and an inner diameter of 25 mm. The turn spacing S may be 0.65 mm. The coil type may be a solid wire and may be made of copper. The turn width W may be 0.6 mm.

In some embodiments, the magnetic coil may have an outer diameter of 48-52 mm and an inner diameter of 23-27 mm. The magnetic coil may include 9-11 turns of wire. The wire may be spaced between adjacent turns with a turn spacing S of 0.55-0.75 mm. The wire may be made of copper, and has a turn width W of 0.5-0.7 mm.

The invention described and claimed herein is not to be limited in scope by the specific preferred embodiments disclosed herein, as these embodiments are intended as illustrations of several aspects of the invention. Indeed, various modifications of the invention in addition to those shown and described herein will become apparent to those skilled in the art from the foregoing description. Such modifications are also intended to fall within the scope of the appended claims.

What is claimed is:

1. A wireless charging system comprising a transmitter and a receiver,
    wherein the transmitter includes:
        a power amplifier accepting an power input; and
        a power transmitter connected to the power amplifier, and comprising a transmitter coil,
    the receiver includes:
        a power receiver comprising a receiver coil,
    wherein the transmitter coil and the receiver coil are magnetically coupled with each other, and each having a sparse routing coil structure, comprising:
    a magnetic coil having a first end and a second end, and routed by a plurality of turns of a wire at a routing plane, wherein each of the plurality of turns of the wire has a diameter different with a diameter of any of the rest of the plurality of turns,
    wherein a ratio of W/S is not larger than 10, S is a turn spacing representing an edge-to-edge distance between adjacent turns of the wire, W is a turn width representing a width of the wire,
    and wherein the first end and the second end are elicited from one of the plurality of turns with a smallest diameter and one of the plurality of turns with a largest diameter, respectively, and extending along a same direction in the routing plane.

2. The wireless charging system in claim 1, wherein each magnetic coil includes a solid wire, the turn width W is a diameter of the wire.

3. The wireless charging system in claim 1, wherein each magnetic coil has a substantially circular shape.

4. The wireless charging system in claim 1, wherein each magnetic coil has an outer diameter of 48-52 mm.

5. The wireless charging system in claim 1, wherein each magnetic coil has an inner diameter of 23-27 mm.

6. The wireless charging system in claim 1, wherein each magnetic coil has 9-11 turns.

7. The wireless charging system in claim 1, wherein the turn spacing S is 0.55-0.75 mm.

8. The wireless charging system in claim 1, wherein the wire is made of copper, and has a turn width W of 0.5-0.7 mm.

9. The wireless charging system in claim 1, wherein each magnetic coil includes a Litz wire including stranded wires and coating materials, the turn width W is an outer diameter of an outer shape of the stranded wires and coating materials.

10. The wireless charging system of claim 1, wherein each magnetic coil includes a printed circuit board or a flexible printed circuit board, the ratio of W/S is not larger than 5.

11. The wireless charging system of claim 1, wherein each magnetic coil includes a printed circuit board or a flexible printed circuit board which comprises a trace clearance, the turn spacing S is a sum of the trace clearance and an added space in addition to the trace clearance.

12. The wireless charging system in claim 11, wherein the turn width W is a width of a trace.

13. The wireless charging system of claim 1, wherein the magnetic coil has one or more layers of coils.

* * * * *